United States Patent [19]

Tanaka

[11] Patent Number: 5,796,592
[45] Date of Patent: Aug. 18, 1998

[54] MODULE MOUNTING STRUCTURE

[75] Inventor: Shinji Tanaka, Tokyo, Japan

[73] Assignee: NEC Corporation, Tokyo, Japan

[21] Appl. No.: 844,659

[22] Filed: Apr. 21, 1997

[30] Foreign Application Priority Data

Apr. 23, 1996  [JP]  Japan ................................. 8-101077

[51] Int. Cl.[6] .......................... H05K 1/11; H01R 9/09
[52] U.S. Cl. ..................... 361/784; 361/822; 361/791; 361/744; 361/728; 361/729; 361/788; 361/748; 439/65; 439/74
[58] Field of Search ................................. 361/784, 822, 361/791, 744, 728, 729, 788, 748; 439/65, 74

[56]  References Cited

U.S. PATENT DOCUMENTS

| 3,790,916 | 2/1974 | Keitel | 339/95 |
|---|---|---|---|
| 5,268,819 | 12/1993 | Lonka | 361/785 |

FOREIGN PATENT DOCUMENTS

| 0268412 | 5/1988 | European Pat. Off. . |
|---|---|---|
| 0287274 | 10/1988 | European Pat. Off. . |
| 0510516 | 10/1992 | European Pat. Off. . |
| 2608328 | 6/1988 | France . |
| 3138281 | 4/1983 | Germany . |
| 3801610 | 8/1989 | Germany . |
| 4445658 | 10/1995 | Germany . |
| 1-304796 | 12/1989 | Japan . |
| 2-68982 | 3/1990 | Japan . |
| 2103435 | 2/1983 | United Kingdom . |

*Primary Examiner*—Leo P. Picard
*Assistant Examiner*—David Foster
*Attorney, Agent, or Firm*—Sughrue, Mion, Zinn, Macpeak & Seas, PLLC

[57]  ABSTRACT

In a module mounting structure, a plurality of lead frames are affixed to an affixing block of resin and then respectively soldered to a plurality of input/output pads provided on a daughter board. Subsequently, lugs protruding from both end portions of the affixing block are inserted in reference holes formed in the daughter board in order to prevent the block from being displaced. Input/output pads are provided on both sides of the daughter board, and electronic parts are mounted on both sides of the daughter board. The lead frames affixed to the affixing block are inserted in through holes formed in a mother board, and then soldered to the mother board. The structure is adaptive to an increase in the number of pins of the daughter board and an increase in module mounting density.

6 Claims, 6 Drawing Sheets

Fig. 1A PRIOR ART
Fig. 1B PRIOR ART
Fig. 2 PRIOR ART
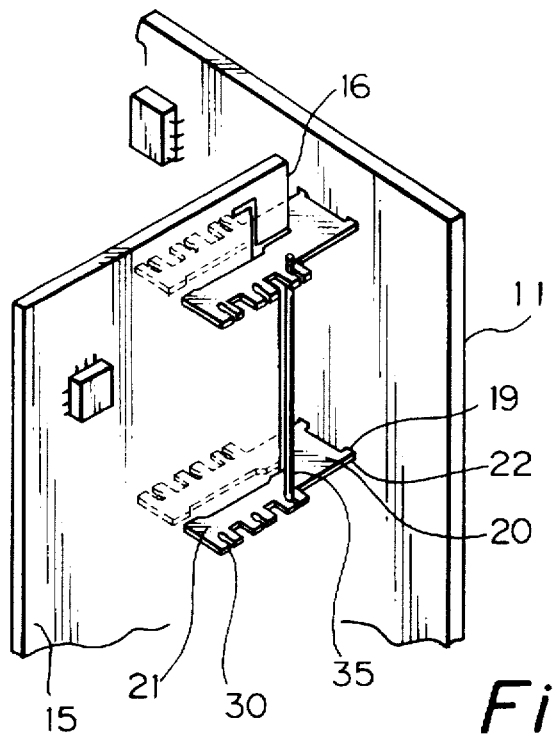
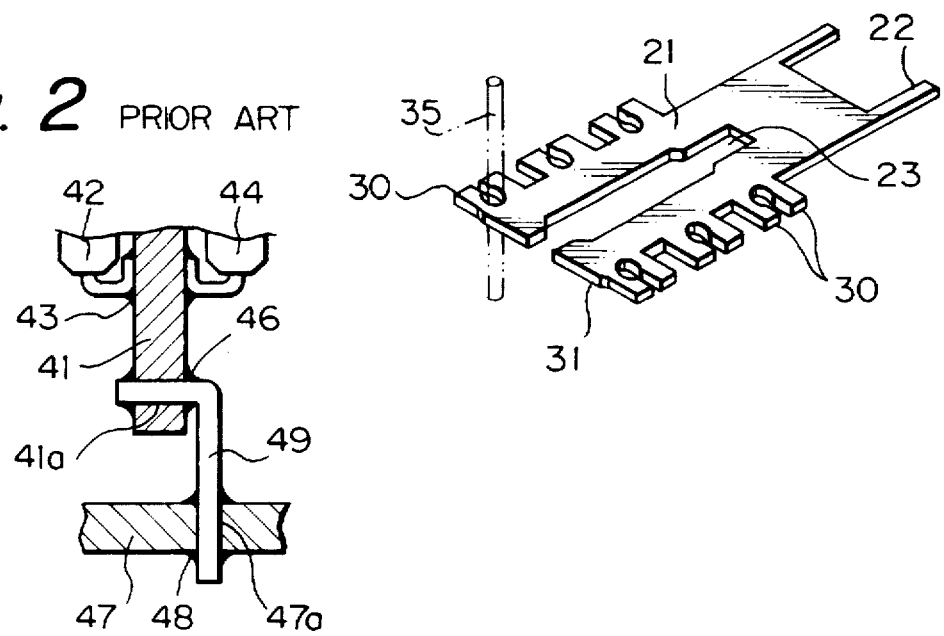

MODULE MOUNTING STRUCTURE

BACKGROUND OF THE INVENTION

The present invention relates to a structure for mounting a module to a mother board tridimensionally by use of lead frames.

To meet the increasing demand for a miniature, dense and high-speed electronic apparatus, it is a common practice to mount electronic parts and ICs (Integrated Circuits) to a printed circuit board to constitute a module, and to mount a number of such modules to a single mother board tridimensionally. The prerequisite with this kind of scheme is that the modules and mother board be electrically interconnected, mechanically surely supported, and low cost. Japanese Patent Laid-Open Publication No. 1-304796, for example, discloses a module mounting method of this kind. Japanese Patent Laid-Open Publication No. 2-68982 teaches a structure for mounting a printed circuit board. However, the conventional structures cannot deal with an increase in the number of pins of the daughter board or an increase in the density or operation speed of the module.

SUMMARY OF THE INVENTION

It is therefore an object of the present invention to provide a module mounting structure adaptive to an increase in the number of pins of a daughter board and an increase in operation speed.

A structure for mounting a module of the present invention has a daughter board carrying electronic parts on both sides thereof, a plurality of input/output pads provided on one side of the daughter board, a plurality of lead frames, an affixing member for affixing the plurality of lead frames, and a mother board formed with a plurality of through holes. The plurality of lead frames are affixed to the affixing member, then soldered to the plurality of input/output pads, then inserted in the plurality of through holes, and then soldered to the mother board.

BRIEF DESCRIPTION OF THE DRAWINGS

The above and other objects, features and advantages of the present invention will become apparent from the following detailed description taken with the accompanying drawings in which:

FIG. 1A is a perspective view showing a conventional mounting structure;

FIG. 1B is a fragmentary enlarged perspective view of the structure shown in FIG. 1A;

FIG. 2 is a section showing another conventional mounting structure;

DESCRIPTION OF THE PREFERRED EMBODIMENT

Figure 3:
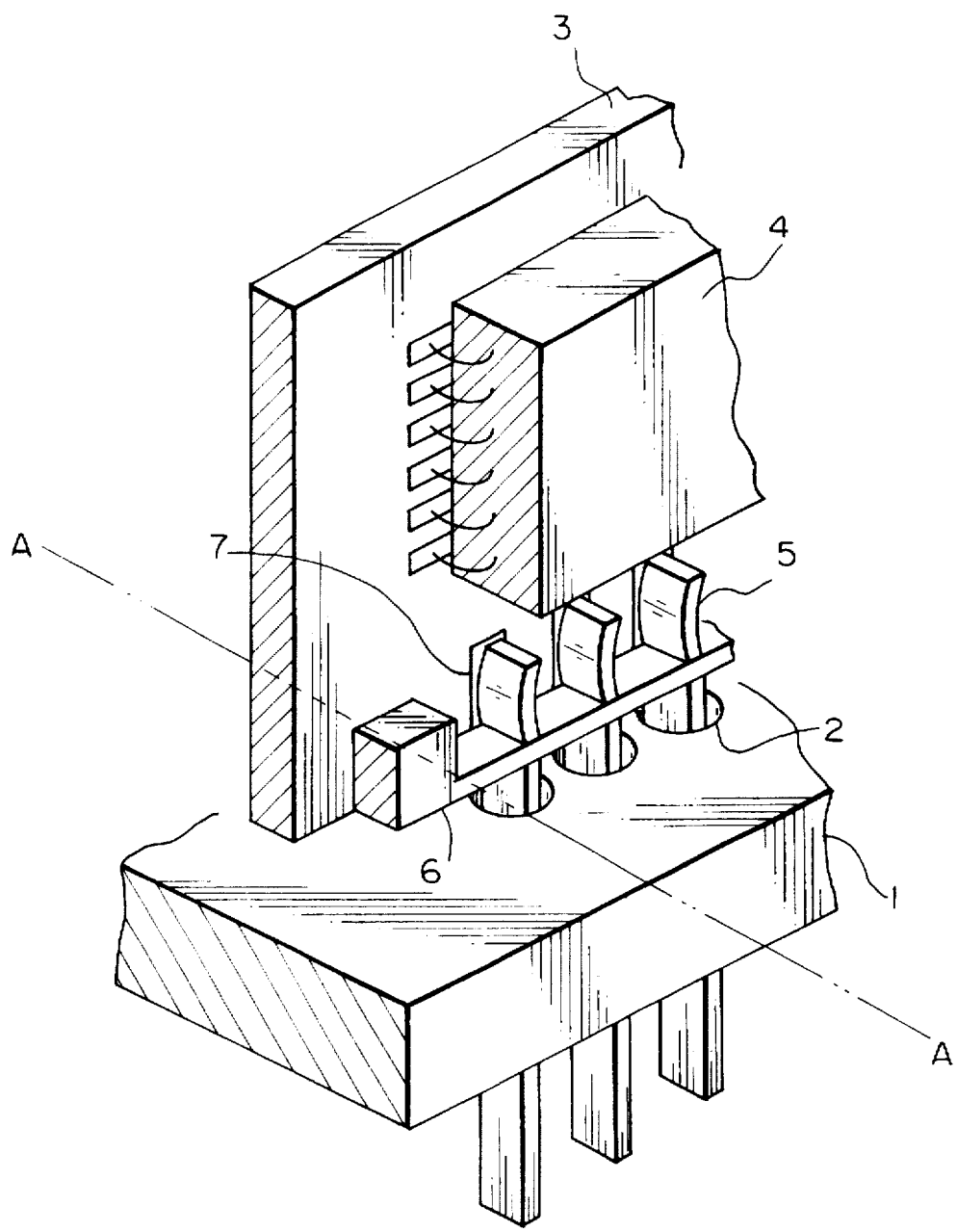
FIG. 3 is a perspective view showing a mounting structure embodying the present invention.

To better understand the present invention, brief reference will be made to a conventional structure for mounting printed circuit boards, shown in FIGS. 1A and 1B. The structure to be described is taught in Japanese Patent Laid-Open Publication No. 2-68982 mentioned earlier. As shown, metal fittings 20 for connection each has a pair of flat body portions 21. Each body portion 21 has a number of parallel fingers 30 at its edge for gripping jumpers 35. A potbelley-like slit is formed in each finger 30 and open at its outer end. When the jumper 35 is inserted in the slit of any one of the fingers 30, the finger 30 grips the periphery of the jumper 35, as illustrated. Notches 31 are formed in the portions of the fingers 30 adjoining the body portion 21, so that needless ones of the fingers 30 can be easily bent and removed by hand.

Lead terminals 22 extend out from each metal fitting while through holes 19 are formed in a mother printed circuit board or mother board 11. The lead terminals 22 are inserted in the through holes 19 and soldered to the mother board 11. After the metal fittings 20 have been mounted to the mother board 11 in a vertical array, a subprinted circuit board or daughter board 15 has its edge or card edge 16 inserted in aligned slits 23 formed in the metal fittings 20. As a result, the daughter board 15 is mounted to the mother board 11 in a vertical position. Subsequently, each jumper 35 has its opposite end portions pressed into the aligned fingers 30 of the nearby metal fittings 20. In this condition, the metal fittings 20 are interconnected by the jumper 35.

The above arrangement of the jumpers 35 makes it needless to form a power supply pattern or similar broad pattern having a great current capacity on the mother board 11 or the daughter board 15; that is, the jumpers 35 play the role of such a broad pattern.

FIG. 2 shows a module mounting structure and method disclosed in Japanese Patent Laid-Open Publication No. 1-304796 also mentioned earlier. As shown, an IC part 42 is mounted on the surface of a daughter board 41 by solder 43, constituting a module 44. A lead pin or lead frame 49 has a generally L-shaped section. The horizontal portion of the lead frame 49 is inserted in a through hole 41a formed in the daughter board 41 and affixed to the board 41 by solder 46. The vertical portion of the lead frame 49 is inserted in a through hole 47a formed in the mother board 47 and then affixed to the board 47 by solder 48.

The conventional structures described above each has some problems left unsolved, as follows. A first problem is that the structures cannot easily deal with the increasing number of pins of a daughter board. Specifically, the metal fitting 20 taught in Laid-Open Publication No. 2-68982 has the slit 23 for nipping the edge of the daughter board 15, and the lead terminals 22 to be inserted in the through holes 19 of the mother board 11. Therefore, to accommodate a great number of pins, one metal fitting 20 must be assigned to each input/output terminal, resulting in complicated production. The lead frame taught in Laid-Open Publication No. 1-304796 has its one end press fitted in the through hole 41a of the daughter board 41. In this configuration, the lead frame 49 can be press fitted from only one side of the daughter board 41. Therefore, to accommodate a great number of pins, the diameter and pitch of the through holes 41a must be reduced, or the size of the daughter board 41 must be increased, resulting in low yield.

A second problem is that the conventional structures are not adaptive to dense module mounting. Specifically, the metal fitting 20 prevents the daughter boards 15 to be mounted to the mother board 11 at a small pitch because the the size of the metal fitting 20 limits the mounting pitch.

A third problem is that the conventional structures are not adaptive to high speed operation. For example, the metal fitting 20 taught in Laid-Open Publication No. 2-68982 has a great surface area, and therefore a great capacitive load.

Figure 4:
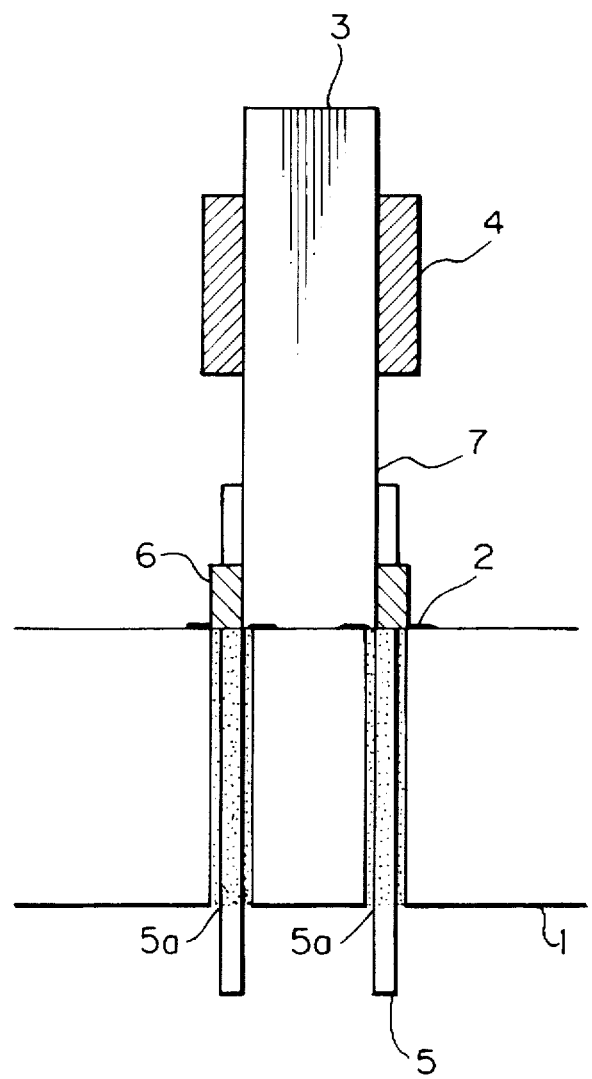
FIG. 4 is a section along line A—A of FIG. 3.

Reference will be made to FIGS. 3 and 4 for describing a preferred embodiment of the module mounting structure in accordance with the present invention. As shown, a mother board 1 carries a number of electronic parts, not shown, thereon. A plurality of patterns, not shown, to be connected to a daughter board 3 are led out via the mother board 1, and each terminates at a respective through hole 2. Solder cream is printed on pads provided on the front and rear of the daughter board 3, and then a preselected electronic part 4 is mounted to the pads via the solder cream. A plurality of signal patterns, ground patterns and power supply patterns are led out at the end of the daughter board 3 adjoining the mother board 1 on each of the front and rear of the board 3. Input/output pads 7 each is provided on the end of the respective pattern. On each of the front and rear of the daughter board 3, a plurality of lead frames 5 are affixed to an affixing member 6 and then respectively soldered to the input/output pads 7 at one end 5a thereof. The affixing member 6 is formed of resin.

Figure 5A:
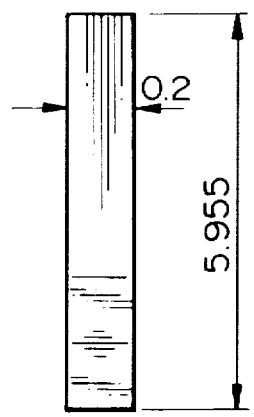
FIG. 5A shows a specific configuration of a lead frame and a specific configuration of an affixing member both of which are included in the embodiment.
Figure 5B:
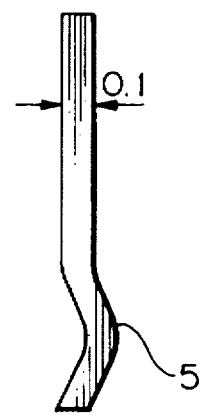
FIG. 5B is a side elevation of the lead frame shown in FIG. 5A.
Figure 5C:
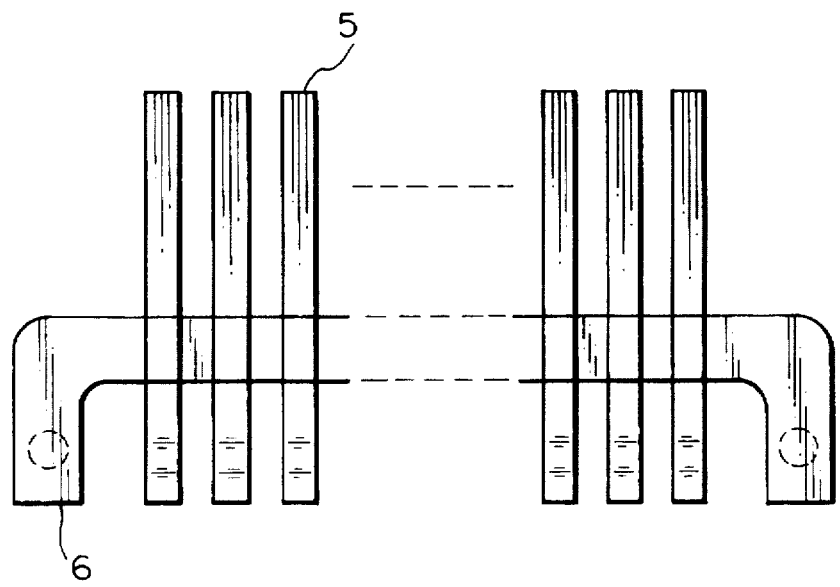
FIG. 5C is a front view showing a plurality of lead frames affixed to the affixing member.
Figure 5D:
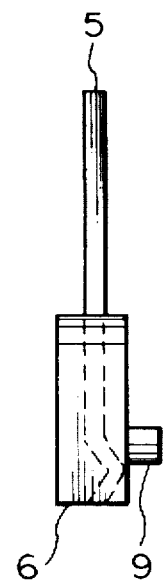
FIG. 5D is a side elevation showing the lead frames and affixing block.
Figure 6:
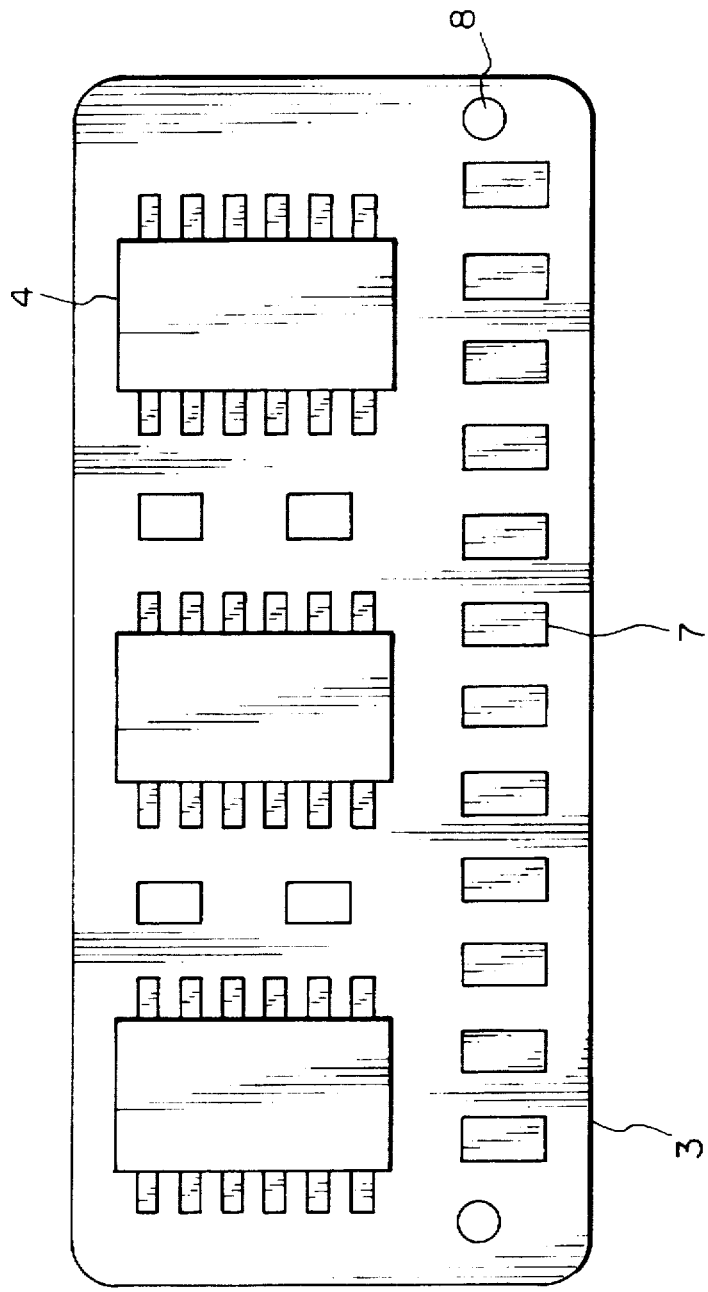
FIG. 6 is a front view of a daughter board included in the embodiment.

FIGS. 5A–5D show a specific configuration of the lead frames 5 and a specific configuration of the affixing block formed of resin 6. The lead frames 5 each having the configuration shown in FIGS. 5A and 5B are affixed to the affixing block 6, as shown in FIGS. 5C and 5D. The number of the lead frames 5 is the same as the number of the input/output pads 7 provided on one side of the daughter board 3. Lugs 9 protrude from both ends of the lower portion of the affixing block 6, as illustrated. The electronic parts 4 are mounted on the daughter board 3, as shown in FIG. 4 in detail. Reference holes 8 (see FIG. 6) are formed in the daughter board 3 at both ends of the lower portion of the board 3. The lugs 9 of the affixing block 6 are respectively received in the reference holes 8 in order to prevent the block 6 from being displaced relative to the daughter board 3.

Figure 7:
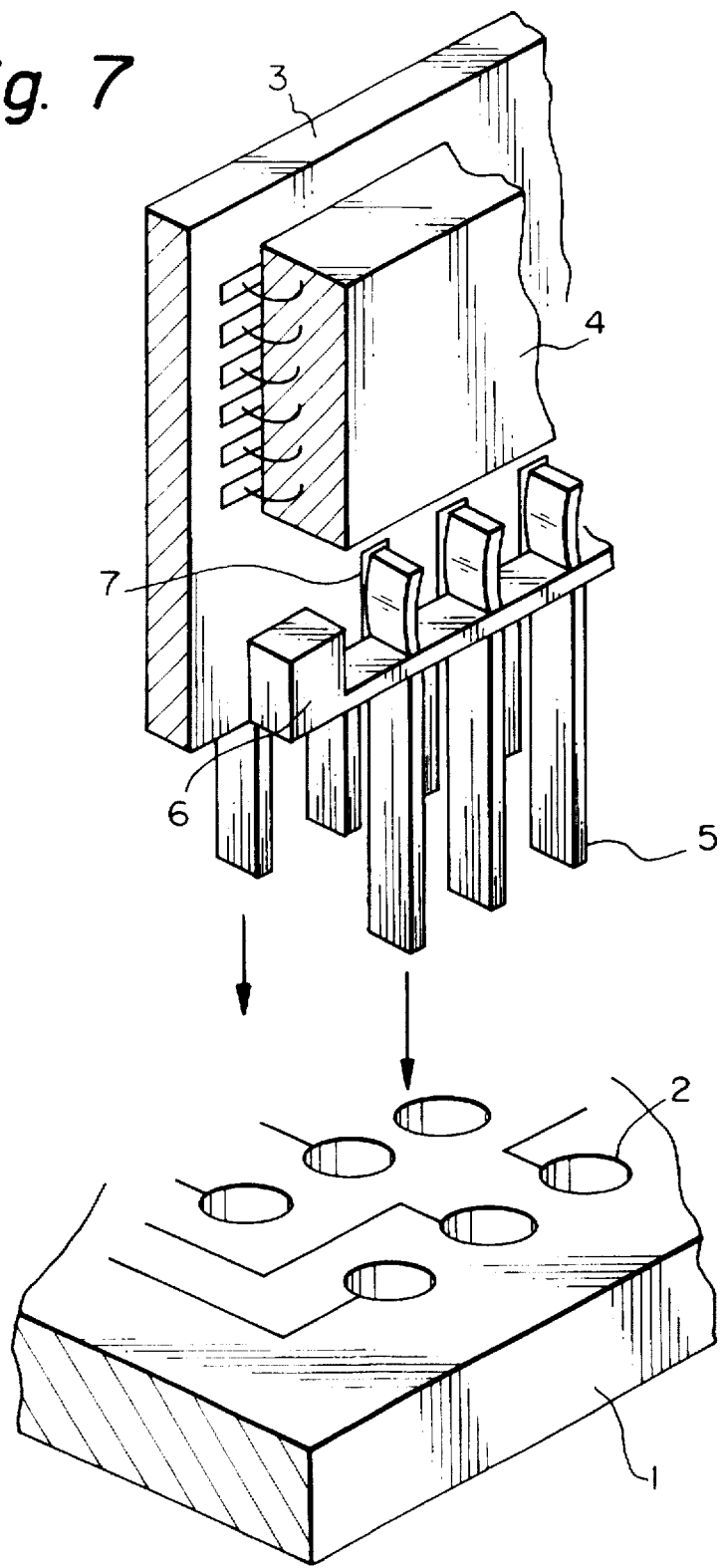
FIG. 7 is a perspective view showing how the daughter board is mounted to a mother board in the illustrative embodiment.

As shown in FIG. 7, the lead frames 6 are affixed to the respective affixing block 6 on each side of the daughter board 3, and soldered to the input/output pads 7. Such two arrays of lead frames 5 are respectively inserted in two arrays of through holes 2 formed in the mother board 1. Subsequently, the lead frames 5 are soldered to the mother board 1, as shown in FIG. 4.

As shown in FIGS. 5A and 5B, the lead frames 5 are 5.955 mm long, 0.2 mm wide, and 0.1 mm thick each. The lead frames 5 are formed of phosphor bronze, and each is provided with a 1 μm thick Ni plating and a 2 μm thick solder plating overlying the Ni plating. Phosphor bronze may be replaced with brass, if desired. In the illustrative embodiment, the daughter board 3 is implemented as a printed circuit board using glass epoxy resin or similar organic insulating resin although it may be implemented as a glass ceramic board. In the embodiment, for the resin constituting the affixing block 6, use is made of a liquid crystal polymer although it may be replaced with polyphenyl sulfide or similar heat-resistant resin.

In summary, it will be seen that the present invention provides a module mounting structure having various unprecedented advantages, as follows. Input/output terminals for different kinds of signals can be provided on both sides of a daughter board, implementing dense module mounting. The structure is therefore adaptive to an increase in the number of pins without increasing the size of a daughter board. Because daughter boards are inserted in through holes formed in a mother board and then soldered to the mother board, there can be reduced the pitch of the daughter boards.

Further, daughter boards and a mother board are interconnected by the shortest distance, so that the structure of the present invention can deal with high speed operation. Specifically, the interconnection distance is short enough to make an inductance component and a capacitance component negligibly small.

Moreover, the structure is practicable with a conventional solder process and is therefore low cost. This is because modules, like other parts, can be collectively mounted to a mother board by solder reflow, and because the daughter board can be inserted in through holes and affixed by soldering together with other DIP (Dual In-Line Package) parts.

Various modifications will become possible for those skilled in the art after receiving the teachings of the present disclosure without departing from the scope thereof.

What is claimed is:

1. A structure for mounting a module, comprising:
   a daughter board carrying electronic parts on both sides thereof;
   a plurality of input/output pads provided on one side of said daughter board;
   a plurality of lead frames;
   an affixing member for affixing said plurality of lead frames; and
   a mother board formed with a plurality of through holes;
   wherein said plurality of lead frames are affixed to said affixing member, then soldered to said plurality of input/output pads, then inserted in said plurality of through holes, and then soldered to said mother board.

2. A structure as claimed in claim 1, wherein a plurality of lead frames are soldered to a plurality of input/output pads provided on the other side of said daughter board also.

3. A structure as claimed in claim 1, wherein said daughter board comprises a printed circuit board using an organic resin as an insulating material.

4. A structure as claimed in claim 1, wherein said daughter board comprises a glass ceramic board.

5. A structure as claimed in claim 1, wherein said affixing member is formed of a liquid crystal polymer.

6. A structure as claimed in claim 1, wherein said affixing member is formed of a heat resistant resin.

* * * * *